United States Patent [19]
Lu

[11] Patent Number: 5,280,190
[45] Date of Patent: Jan. 18, 1994

[54] SELF ALIGNED EMITTER/RUNNER INTEGRATED CIRCUIT

[75] Inventor: Chih-Yuan Lu, Hsin-chu, Taiwan

[73] Assignee: Industrial Technology Research Institute, Hsinchu, Taiwan

[21] Appl. No.: 977,180

[22] Filed: Nov. 16, 1992

Related U.S. Application Data

[60] Division of Ser. No. 672,916, Mar. 21, 1991, Pat. No. 5,086,017, continuation-in-part of Ser. No. 760,576, Sep. 16, 1991, abandoned.

[51] Int. Cl.$^5$ .............. H01L 27/082; H01L 27/102; H01L 23/48; H01L 29/76
[52] U.S. Cl. .................. 257/587; 257/383; 257/576; 257/751; 257/764
[58] Field of Search ............ 257/382, 383, 412, 413, 257/576, 587, 588, 755, 754, 757, 763, 764, 761, 751, 768, 336

[56] References Cited

U.S. PATENT DOCUMENTS

| | | | |
|---|---|---|---|
| 4,560,421 | 12/1985 | Maeda et al. | 257/374 |
| 4,822,749 | 4/1989 | Flanner et al. | 257/382 |
| 4,954,865 | 9/1990 | Rokos | 257/382 |
| 4,985,746 | 1/1991 | Asahina | 257/383 |
| 5,055,094 | 10/1991 | Minam et al. | 257/412 |
| 5,070,391 | 12/1991 | Liou et al. | 257/750 |

FOREIGN PATENT DOCUMENTS

| | | | |
|---|---|---|---|
| 0296718 | 12/1988 | European Pat. Off. | 257/382 |
| 55-108772 | 8/1980 | Japan | 257/412 |
| 59-169179 | 9/1984 | Japan | 257/413 |
| 63-204628 | 8/1988 | Japan | 257/412 |
| 1-281755 | 11/1989 | Japan | 257/382 |
| 2-36539 | 2/1990 | Japan | 257/413 |

*Primary Examiner*—Rolf Hille
*Assistant Examiner*—Steven Loke
*Attorney, Agent, or Firm*—George O. Saile

[57] ABSTRACT

A device structure is described wherein metal silicide contacts are made to polycrystalline silicon regions and nonmetal silicide contacts to monocrystalline silicon regions of an integrated circuit device. Polycrystalline silicon regions are formed and patterned. A dielectric masking layer is formed over the polycrystalline and monocrystalline silicon regions. The surfaces of the masking layer are covered and the irregularities of the surfaces filled with an organic material to thereby planarize the surfaces. The organic material is blanket etched until the masking layer which covers the polycrystalline silicon regions is exposed and allowing the masking layer which covers the monocrystalline silicon regions to remain covered with organic material. The exposed masking layer is removed from the polycrystalline regions. The remaining organic material is removed. A layer of metal film is blanket deposited over the wafer. The metal silicide contacts to polycrystalline regions are formed. An insulating layer is formed over the surface of the structure. Openings are made in the insulating layer to the monocrystalline regions and the silicide layer on top of the polycrystalline silicon regions. Nonmetal silicide contacts, such as aluminum or tungsten with or without a barrier metal are made to the monocrystalline regions.

7 Claims, 3 Drawing Sheets

SELF ALIGNED EMITTER/RUNNER INTEGRATED CIRCUIT

This is a division of application Ser. No. 07/672,916 filed Mar. 21, 1991 now U.S. Pat. No. 5,086,017 issued Feb. 4, 1992 and continuation in part of application Ser. No. 07/760,576 filed Sep. 16, 1991 now abandoned.

BACKGROUND OF THE INVENTION (1) Field of the Invention

The invention relates generally to the fabrication of integrated circuits, and more particularly to a method and resulting structure for forming metal silicide contacts to polycrystalline silicon regions and nonmetal silicide contacts to monocrystalline regions.

(2) Description of the Prior Art

Metallization is a critical processing technique throughout the integrated circuit process. It is particularly critical in the formation of electrical contacts to semiconductor regions in silicon integrated circuits in the one micron and submicron feature size era.

Aluminium has found major use as both an electrical contact material to silicon semiconductor regions and as the second or higher level metallurgy in integrated circuits. However, aluminium does have problems particularly as an electrical contact to monocrystalline silicon regions as is well understood by those in the art. One problem is contact resistance, especially in submicrometer contact hole regions.

To overcome these problems of direct aluminum to silicon or aluminum-silicon to silicon electrical contacts the use of a metal silicide layer between these materials have widely begun to be used. Self aligned transition and noble metal silicides of metal such as platinum, palladium, cobalt, nickel, titanium, tantalum, tungsten, etc. have been used. There are problems with this alternative involving metallurgical interaction, consummation of the shallow silicon semiconductor region, junction leakage, etc. The problems have been described in the article by C. Y. Lu et al in IEEE Transaction of Electron Devices Vol. ED-38(2), pp. 246-254, February 1991. Other barrier materials proposed are titanium nitride, titanium carbide, titanium-tungsten, and the like.

Metallic silicides have also been used to improve the conductivity of polycrystalline silicon that is also widely used in integrated circuits. Metal silicides used on polycrystalline silicon, the so called polycide, as gate electrodes, interconnection runners and the like. However, the prize for reduction of polycide resistance versus polysilicon is the difficulty of line width scaling down due to etching profile control problem of polycide structure. The reduction of linewidths and tighter linewidth control is just what is required for the era of one micrometer and submicrometer feature sizes.

It is very difficult to control the linewidth of a polycrystalline silicon metal silicide structure or polycide structure, because its double layer structure is very difficult to pattern especially in the manufacturing environment. The Self Aligned metal SILICIDE of SALICIDE process has been developed to bring more process control. The Salicide process produces simultaneously a metal silicide on the source/drain regions of an MOSFET and the gate electrode of the MOSFET. This process patterns the polycrystalline silicon gate electrode before the metal silicide is formed, so only a single polycrystalline silicon layer needs be etched and the linewidth control is much easier than if a double layer were to be etched.

C. K. Lau U.S. Pat. No. 4,545,116 and F. K. Choi U.S. Pat. No. 4,859,278 describe the use of Salicide processes for contacting both monocrystalline and polycrystalline silicon. These processes illustrate the formation of self aligned metal silicide formation on both forms of silicon simultaneously. In many applications that simultaneous formation is highly advantageous.

There are some applications in one micrometer and submicrometer in both MOSFET and Bipolar technologies where it is desirable to have a thick metal silicide on the gate electrode and interconnection runner level, but without metal silicide on the source/drain or bipolar element level. The reasons for this is for MOSFET integrated circuits that thick metal silicide on the source/drain regions easily causes junction leakage problems which are not compatible with shallow junction requirements for punch through control. The reason for Bipolar integrated circuits is the induced base to collector leakage problem.

It is therefore an object of the invention to provide a method for making MOSFET integrated circuits in the one micrometer and submicrometer feature size era which takes advantage of the Salicide process in linewidth control that is the width uniformity control of conductor lines with metal silicide used at the gate electrode interconnection level and without a metal silicide at the electrical contact to source/drain regions level.

It is a further object of the invention to provide an integrated circuit structure in the one micrometer and submicrometer feature size era which takes advantage of the Salicide process resulting structure in linewidth control with metal silicide used at the second level interconnection, such as buried contact local interconnect as well known by those in the art and without a metal silicide at the electrical contact to semiconductor regions level.

SUMMARY OF THE INVENTION

A method is described for forming metal silicide contacts to polycrystalline silicon regions and nonmetal silicide contacts to monocrystalline silicon regions of an integrated circuit device. Polycrystalline silicon regions are formed and patterned. A dielectric masking layer is formed over the polycrystalline and monocrystalline silicon regions. The surfaces of the masking layer are covered and the irregularities of the surfaces filled with an organic material to thereby planarize the surfaces. The organic material is blanket etched until the masking layer which covers the polycrystalline silicon regions is exposed and allowing the masking layer which covers the monocrystalline silicon regions to remain covered with organic material. The exposed masking layer is removed from the polycrystalline regions. The remaining organic material is removed. A layer of metal film is blanket deposited over the wafer. The metal silicide contacts to polycrystalline regions are formed. An insulating layer is formed over the surface of the structure. Openings are made in the insulating layer to the monocrystalline regions and metal silicide layer on top of polycrystalline silicon regions. Nonmetal silicide contacts, such as aluminum or tungsten with or without a barrier metal are made to the monocrystalline regions.

The method and resulting structure can form integrated circuit structures for either MOSFET or bipolar transistor integrated circuit structures.

An integrated circuit structure with polycrystalline silicon gate electrodes and conductive runners having self aligned metal silicide contacts is provided. An insulating layer is formed over the surface structures of the integrated circuit structure having openings therethrough to monocrystalline silicon source and drain regions in the monocrystalline silicon substrate and metal silicide layer on top of polycrystalline silicon regions. Nonmetal silicide contacts to the source and drain regions are made through the openings and filling the openings.

DESCRIPTION OF THE PREFERRED EMBODIMENTS

Figure 1:
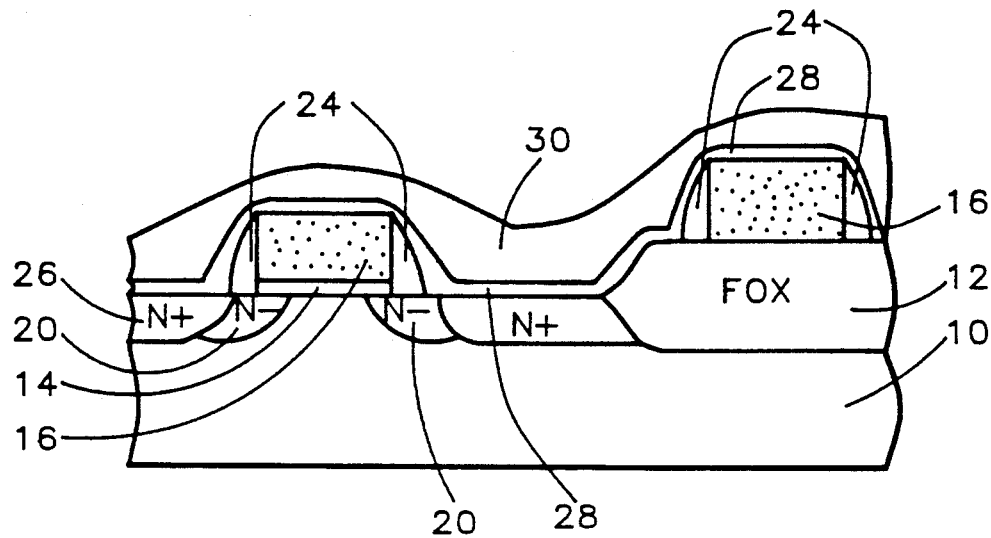
FIGS. 1 through 4 is a cross sectional schematic illustration of one embodiment for forming the self aligned metal silicide contacts to polycrystalline silicon gate level regions and self aligned nonmetal silicide contacts to the monocrystalline silicon regions.

Referring now more particularly to FIG. 1, there is shown a first embodiment method for making the lightly doped drain device of the present invention. The first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field Oxide pattern, FOX 12. Then semiconductor devices can be provided in the silicon mesas according to the following processes.

The surface of the silicon substrate 10 is thermally oxidized to form the desired gate oxide 14 thickness. The preferred thickness is between about 80 to 200 Angstroms. The polysilicon layer 16 is blanket deposited by LPCVD (Low Pressure Chemical Vapor Deposition) method. The preferred thickness of the polysilicon layer 14 is between about 2000 to 4000 Angstroms. The polysilicon layer 16 is ion implanted with phosphorous or arsenic ions under the conditions 5 to 10 E 15 dosage per area and 20 to 60 Kev. or doped with phosphorus oxychloride at a temperature about 900° C. The layers 14 and 16 are patterned by conventional lithography and anisotropic etching techniques as are conventional in the art to provide a desired pattern of gate electrodes and interconnection runners on the FOX 12 surfaces or elsewhere as seen in FIG. 1.

The source/drain structure of the MOS FET may now be formed by the following steps. The FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 1, for example shows the ion implantations of N-dopants. Lithographic masks may be required to protect the areas not to be subjected to that particular N- ion implantation. The formation of the lithographic masks are done by conventional lithography and etching techniques. The N- lightly doped drain implantation 20 is done with, for example phosphorous P31 at a dose of between about 1 to 10 E 13 atoms/cm.$^2$ and with an energy of between about 20 to 40 Kev.

The dielectric spacer 24 is now to be formed followed by the completion of the lightly doped drain source/drain structures. A low temperature silicon oxide deposition is preferred such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 24 is between about 2000 to 5000 Angstroms and preferably about 2500 Angstroms.

An anisotropic etching of this layer produces the dielectric spacer layer 24 on the sidewalls of the layer structures 14, 16. The preferred anisotropic etching uses a conventional reactive ion etching ambient.

A thin silicon oxide, silicon nitride or the like masking layer 28 is formed upon the layer structure regions 14, 16, the spacers 24 and the exposed monocrystalline silicon substrate regions. The conditions for forming this layer 28 are LPCVD deposition of TEOS or LPCVD silicon nitride deposition at about 600° to 900° C. The preferred thickness of this oxide layer is between about 200 to 1000 Angstroms and a preferred thickness of about 600 Angstroms.

The N+ source/drain ion implantation uses Arsenic, As75 with a dose of between about 2 E 15 to 1 E 16 atoms/cm.$^2$ and energy of between about 20 to 70 Kev. to complete the source/drain regions 26 of the N channel lightly doped drain MOS FET integrated circuits device as seen in the FIG. 1.

An organic material layer 30 is deposited on the surfaces of the structure that is covered by masking layer 28. It is deposited or deposited and flowed in such a way that the irregularities of the surfaces of the structure are substantially filled as seen in FIG. 1. This causes a substantial planarization of the formerly irregular surface. The organic materials that can perform in this nature are photoresists such as diazoquinone/novolac materials (HPR-206, Shipley S-1400 or the like), or any other novolac resin resist material. Other organic materials that can also be used are polyimides, spin-on-glass materials and the like.

The process to coat the organic material 30 can be briefly described. The wafers are cleaned and dehydrated by baking and primed as is known in the art. The wafer is spin coated with, for example a resist material by dispensing the resist solution onto the wafer surface, and then rapidly spinning the wafer until the resist is essentially uniformly coated. The resist is dried. The spinning speed can be adjusted to give the desired film thickness. In addition, the viscosity of the material can be varied such that the desired planarity flow on the wafer is achieved.

Figure 2:
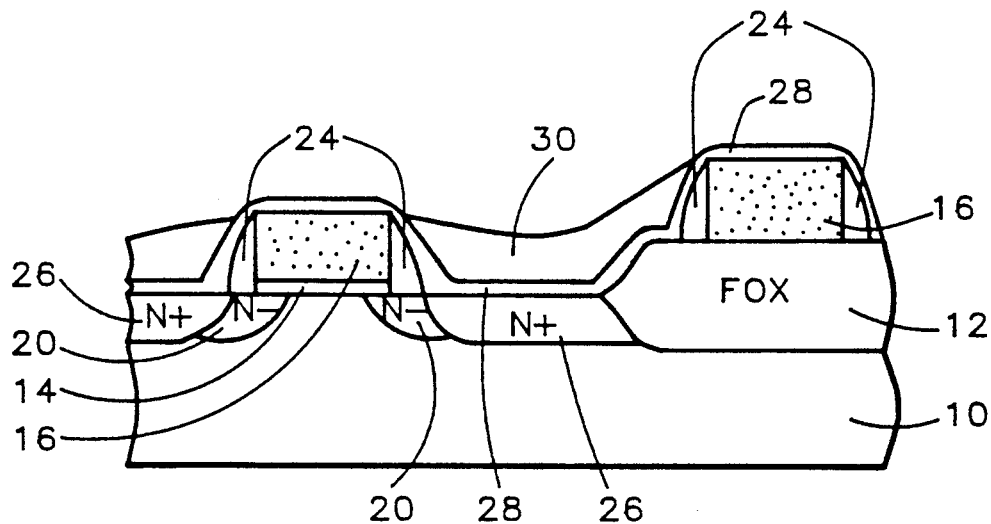

Referring now to FIG. 2, blanket etching of the organic material 30 is effected until the masking layer 28 which covers the polycrystalline silicon regions 16 is exposed. The monocrystalline silicon regions 26 or the like within the silicon substrate remain covered with the organic layer 30 as seen in FIG. 2. Plasmas containing pure oxygen at moderate pressure produce species that attack organic material to form carbon monoxide, carbon dioxide and water as the end products. Such oxygen plasmas provide a highly selective etching for removing organic material, since the oxygen plasma do not etch silicon oxide, silicon, silicon nitride, or aluminium, etc. The addition of fluorine containing gases to the oxygen plasma causes the etch rate of organic materials to significantly increase.

The time to completion of the etch back process can be calculated by determining the average etch rate of the process and calculating the time necessary to etch through the layer we intended to remove. Some endpoint detection can be used to know when to stop the etching once the masking dielectric layer 28, which covers the polycrystalline silicon regions 16 is exposed. One endpoint detection is to monitor the intensities of spectral lines emitted from the plasma changes when some new layer or layers are exposed. The laser interferometry of wafer surface is used not only to determine endpoint but also to continuously monitor etch rate. The details can be found in "Silicon Processing for VLSI Era", Vol. 1 by S. Wolf and R. N. Tauber, Lattice Press, Calif., 1986 pages 565 to 568.

A thin insulator chemical or dip etch is now used to expose the polycrystalline silicon regions 16. This etch will, of course be a different material depending upon the composition of the insulator layer 28. For example, if the masking layer 28 is silicon oxide the etch would be a conventional 10% aqueous hydrofluoric acid solution or buffered ($NH_4OH$) hydrofluoric acid solution.

The organic material 30 is now removed by a conventional ashing process or by sulfuric peroxide solution clean plus plasma ashing. The masking layer 28 still remains covering the monocrystalline silicon regions 26 and the like in the substrate.

The self aligned metal silicide layer is now to be formed on the polycrystalline silicon regions 16. A thin layer of metal film is deposited upon the surface of the wafer blanket. The metals that are useful in my invention include titanium, cobalt, tantalum, molybdenum, tungsten, palladium and platinum. The metal can be deposited by sputtering or evaporation methods. It is preferably deposited by sputtering. The operational thickness is between about 300 to 1500 Angstroms and the preferred thickness is between about 800 to 1000 Angstroms. The preferred metals for this metal silicide are titanium and cobalt.

Figure 3:
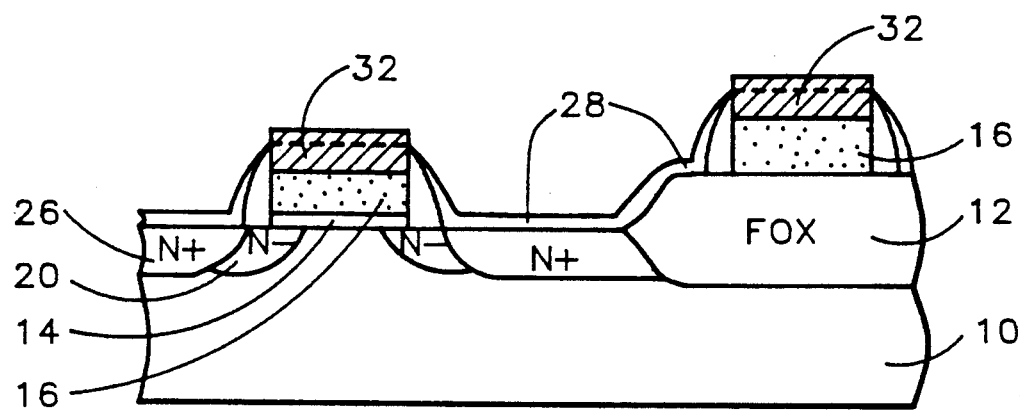

The structure having the metal layer formed thereover the layers 16 is now placed within a chamber having an inert atmosphere such as nitrogen, argon or a vacuum. The structure is heated within this chamber to react the metal with the polycrystalline silicon layer regions to form metal silicide layers or contacts 32 and leaving the metal unreacted where it covers the masking layer 28. The heating conditions for the reaction are 600° to 800° C. in a conventional furnace for about 20 to 40 minutes or in rapid thermal anneal system for 60 to 200 seconds. The unreacted portions of the metal layer are then removed by exposing the structure to an etchant selective for the metal but not reactive to the metal silicide layer or contact 32. Typical etchants for this usage are hydrogen peroxide for unreacted molybdenum and not to etch molybdenum silicide; 3:1 HCl:hydrogen peroxide (30%) for unreacted cobalt and to not etch cobalt silicide; for unreacted titanium and to not etch titanium silicide are 5600 ml. water, 4200 ml. hydrogen peroxide and 2800 ml. phosphoric acid at 80° C. for 7 to 12 minutes or use a standard sulfuric acid and hydrogen peroxide cleanup solution. After cleanup the unreacted metal film or metal nitride on the oxide surface, a second anneal either by furnace or by rapid thermal anneal at 900° C. stabilizes the metal silicide films. This completes the FIG. 3 structure.

Figure 4:
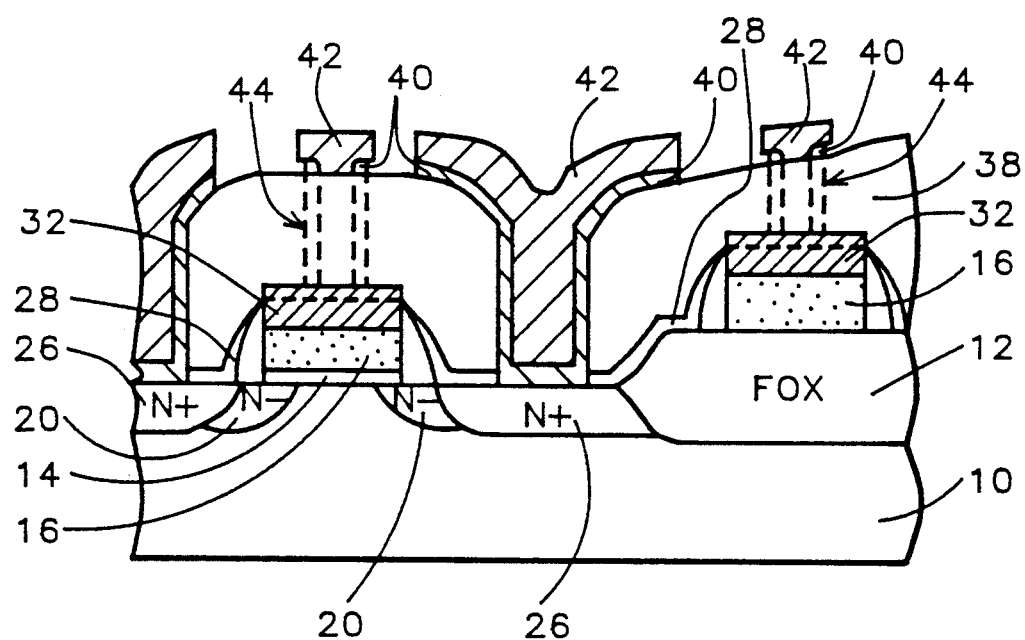

FIG. 4 shows the completion of the nonmetal silicide contacts to the monocrystalline silicon regions such as source/drain regions 26. An insulating structure 38 may be composed of, for example a layer of silicon dioxide and a much thicker layer of borophosphosilicate glass, phosphosilicate glass or similar insulating layer. The operational thicknesses of these layers are between about 1000 to 2000 Angstroms for the oxide layer and between about 2000 to 10,000 or more Angstroms for the glasseous layer. These layers are typically deposited by chemical vapor deposition in low pressure or atmospheric pressure, or in a plasma enhance reactive chamber.

The contact windows or openings are now formed through the insulating layered structure to the source/drain regions 26 or the like in the device regions, and to the top of metal silicide layer on top of polycrystalline silicon regions in the device regions or on top of FOX. The openings are not shown to the polycrystalline silicon regions, because they are outside of the cross-section of FIG. 4. This process step is conventionally done by lithography and etching techniques which preferably use a reactive ion etching process that will anisotropically etch both components of the insulating layer structure 38. A typical reactive ion etching process using fluorine containing etching chemical species. These oxide/glass layers etching processes are well known to those in the art. The size of the contact window opening can be as small as limitation of the etching and lithography patterning capability.

A barrier metal layer 40 is deposited over the exposed device region 26 and the insulating layer structure 38 both above and on the sides of the opening. This layer may be deposited by, for example chemical vapor deposition or sputtering. The operational thickness is between about 100 to 2000 Angstroms and the preferred thickness is between about 200 to 1000 Angstroms. The thickness of this layer 40 is dependent upon the height and profile of the contact hole. The formula for this thickness relationship is 0.07X to 0.15X where X is the contact opening size. The preferred metal used is either TiW or TiN.

The metallurgical connection is completed by the blanket deposition of metal layer 42 which fills the openings in the insulating layer 38 as shown in FIG. 4. This metal layer 42 is deposited by conventional methods and may be aluminum, aluminum-silicon, aluminum-silicon-copper, conductively doped polysilicon, tungsten or the like. Openings 44 can also be made through the insulating layer 38 to the gate electrode metal silicide polycrystalline silicon regions 16, 32 and the interconnection runners metal silicide polycrystalline silicon regions 16, 32 as seen in FIG. 4. The non-metal silicide metallurgy 40, 42 is now patterned by conventional lithography and etching technology as is known in the art to complete the FIG. 4 structure.

Figure 5:
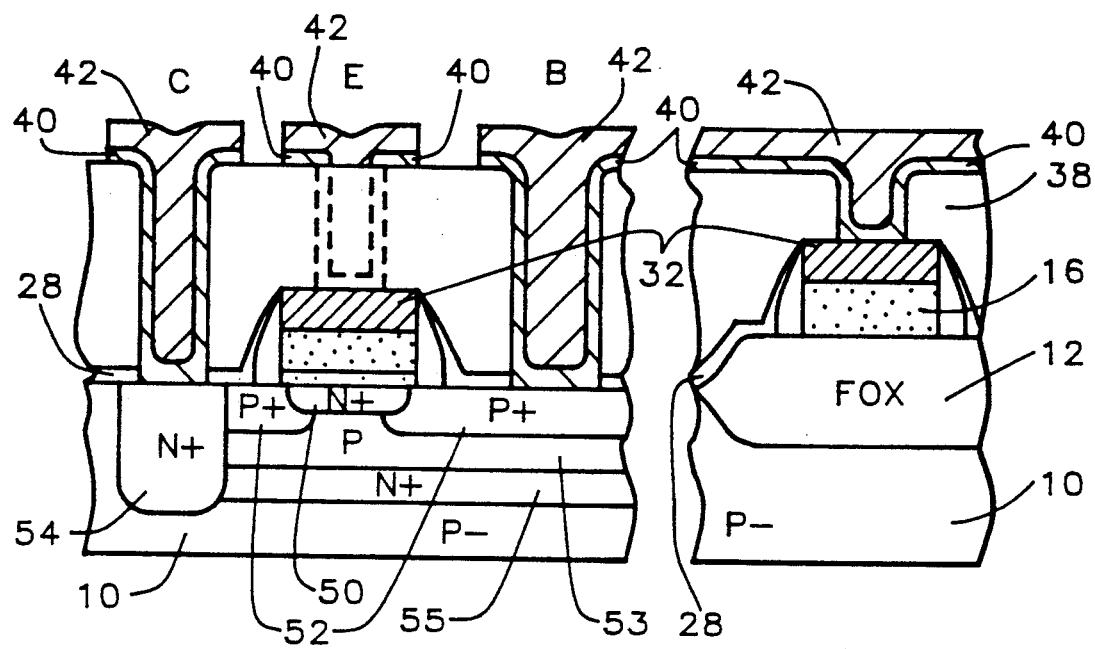
FIG. 5 is a cross sectional schematic illustration of a second embodiment for a bipolar transistor integrated circuit which results from the method of the invention.

Referring now to FIG. 5, a bipolar transistor or BICMOS integrated circuit structures can also be made advantageously by slight modifications to the FIGS. 1 through 4 embodiment for MOSFET integrated circuits. The modifications are only involved with the type of regions formed within the monocrystalline silicon substrate, that is collector, base and emitter rather than source/drain regions. The regions 26 could be formed as base regions and the polycrystalline silicon regions without layer 14 underneath could be emitter interconnections or other interconnection runners as are shown in FIG. 4. FIG. 5 illustrates the bipolar transistor embodiment wherein like numbers to FIGS. 1-4 indicate like device elements. The bipolar transistor includes emitter region 50; base region 52, 53 and collector region 54, 55. We show the alternative of connecting the base region 52 to a conductive runner 16, 32 in FIG. 5. The break shown in conductor 40, 42 electrically connecting the base region 52 to a conductive runner 16, 32 in FIG. 5 illustrates that there may be some distance between these circuit elements as will be understood by those skilled in the art. An NPN device is illustrated, but it is understood by those skilled in the art that a PNP device can be used by simply interchanging the conductitity types. We refer to "VLSI Technology" International Edition and Second Edition 1988 by S. M. Sze and published by McGraw-Hill Book Co. Singapore pages 499-505 for a generalized bipolar IC technology discussion including fabrication process sequence for background of state of the art in the field.

Figure 6:
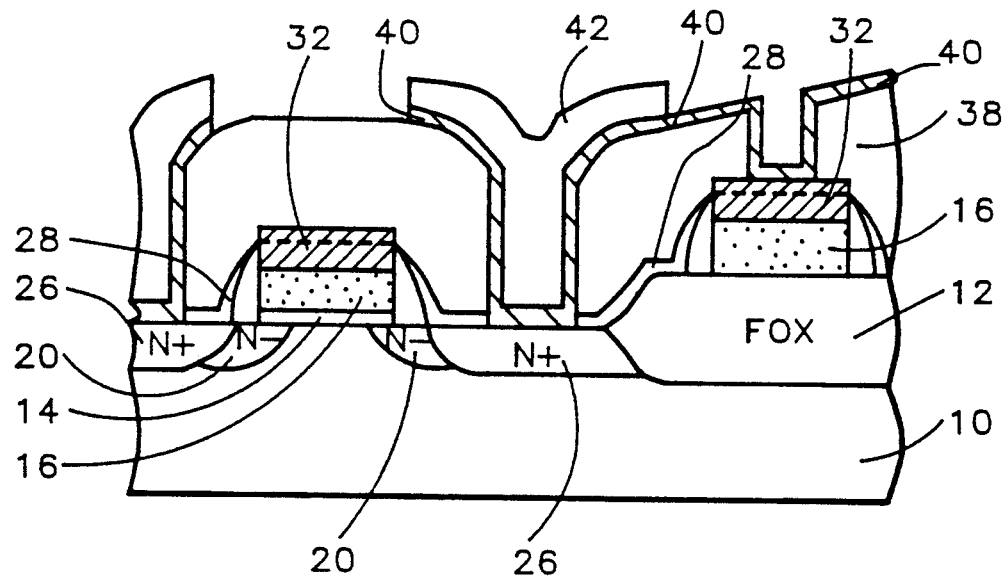
FIG. 6 is a cross sectional schematic illustration which is a variation to the FIG. 4 embodiment wherein the silicon surface contact can be connected to a gate-level conductive runner.

FIG. 6 illustrates the connection of silicon surface contact 26 to a gate-level conductive runner 16, 32. The conductive runner can be located on any insulator such as seen in the FIG. 6 wherein it is located on the field silicon oxide region, FOX 12. Alternatively, it could be located on the thin silicon oxide region 14.

While the invention has been particularly shown and described with reference to the preferred embodiments thereof, it will be understood by those skilled in the art that various changes in form and details may be made without departing from the spirit and scope of the invention.

What is claimed is:

1. A bipolar integrated circuit structure formed in and on a monocrystalline silicon substrate comprising:
    bipolar transistor regions including emitter, base and collector regions located in said substrate;
    polycrystalline silicon conductive runners located over said substrate having self aligned metal silicide contacts;
    an insulating layer over the surface structures of said integrated circuit structure having openings therethrough to said bipolar transistor regions in the monocrystalline silicon substrate;
    contacts other than metal silicide composition to said bipolar transistor regions through said openings and filling said openings; and
    means for electrically connecting at least some of said base regions and conductive runners.

2. The integrated circuit of claim 1 wherein said contacts to said bipolar transistor regions are base and collector contacts.

3. The structure of claim 1 wherein said metal silicide is composed of a metal from the group consisting of titanium, cobalt, tantalum, molybdenum, tungsten, palladium and platinum.

4. The structure of claim 1 wherein said insulating layer is composed of a borophosphosilicate glass.

5. The structure of claim 1 wherein each of said contacts other than metal silicide composition to said bipolar transistor regions includes a barrier layer and an aluminium layer.

6. The structure of claim 1 wherein the contact to said emitter region is polycrystalline silicon with self aligned metal silicide contact.

7. The integrated circuit of claim 1 wherein at least some said base regions are directly and electrically connected to at least some said conductive runners using the same level metallurgy.

* * * * *